(12) United States Patent
Barsukou

(10) Patent No.: US 12,715,759 B2
(45) Date of Patent: Aug. 25, 2026

(54) MECHANICALLY COUPLED PIEZOELECTRIC MEMS MICROPHONE

(71) Applicant: SKYWORKS SOLUTIONS, INC., Irvine, CA (US)

(72) Inventor: Siarhei Dmitrievich Barsukou, Takarazuka (JP)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 586 days.

(21) Appl. No.: 18/122,872

(22) Filed: Mar. 17, 2023

(65) Prior Publication Data

US 2023/0303387 A1 Sep. 28, 2023

Related U.S. Application Data

(60) Provisional application No. 63/269,950, filed on Mar. 25, 2022.

(51) Int. Cl.
*B81B 3/00* (2006.01)
*B81C 1/00* (2006.01)
(Continued)

(52) U.S. Cl.
CPC ........ *B81B 3/0021* (2013.01); *B81C 1/00158* (2013.01); *H04R 17/02* (2013.01); *H10N 30/308* (2023.02); *B81B 2201/0257* (2013.01); *B81B 2203/0118* (2013.01); *B81B 2203/0127* (2013.01); *B81B 2203/0307* (2013.01);
(Continued)

(58) Field of Classification Search
CPC H04R 17/02; H04R 2201/003; B81B 3/0021; B81B 2201/0257; H10N 30/308
See application file for complete search history.

(56) References Cited

U.S. PATENT DOCUMENTS 8,948,419 B2 2/2015 Zhang
9,055,372 B2 6/2015 Grosh et al.
(Continued)

FOREIGN PATENT DOCUMENTS

CN 107128870 A 9/2017
EP 3557881 A1 10/2019
(Continued)

OTHER PUBLICATIONS

Chen et al. "Acoustic Transducers Built on Edge-released MEMS Structures," Solid-State Sensors, Actuators, and Microsystems Workshop Hilton Head Island, South Carolina, Jun. 6-10, 2010, pp. 234-237.

(Continued)

*Primary Examiner* — Moazzam Hossain
(74) *Attorney, Agent, or Firm* — Lando & Anastasi, LLP

(57) ABSTRACT

There is provided a piezoelectric microelectromechanical systems microphone comprising a sensor including at least one piezoelectric layer, at least one constraint in contact with the sensor at a position, such that the sensor is supported by the at least one constraint, and such that the sensor that the sensor has a membrane region to one side of the at least one constraint and a cantilevered region to the other side of the at least one constraint and a cavity defined at least partially by the at least one constraint. There is also provided a method of manufacturing the microphone.

18 Claims, 11 Drawing Sheets

(51) Int. Cl.
*H04R 17/02* (2006.01)
*H10N 30/30* (2023.01)

(52) U.S. Cl.
CPC ... *B81B 2203/0315* (2013.01); *B81B 2203/04* (2013.01); *B81C 2201/0163* (2013.01); *B81C 2201/0174* (2013.01); *H04R 2201/003* (2013.01)

(56) References Cited

U.S. PATENT DOCUMENTS 9,832,573 B2 11/2017 Hall et al.
9,902,612 B2 2/2018 Dehe et al.
10,510,945 B1 12/2019 Langlois et al.
10,626,007 B2 4/2020 Bretthauer et al.
10,964,880 B2 3/2021 Grosh et al.
2008/0123878 A1 5/2008 Zhe et al.
2009/0092273 A1 4/2009 Zhe et al.
2011/0051985 A1 3/2011 Hwang et al.
2013/0121509 A1 5/2013 Hsu et al.
2016/0219374 A1 7/2016 Hall et al.
2016/0219375 A1 7/2016 Hall et al.
2017/0085994 A1 3/2017 Clerici et al.
2017/0186940 A1 6/2017 Bevilacqua et al.
2017/0339494 A1* 11/2017 Perletti ................ H04R 19/005
2018/0091905 A1 3/2018 Clerici et al.
2018/0186623 A1* 7/2018 Vossough .............. G01L 9/0042
2018/0299335 A1 10/2018 Wong et al.
2019/0281393 A1 9/2019 Grosh et al.
2019/0327562 A1 10/2019 Cerini et al.
2020/0148532 A1 5/2020 Grosh et al.
2020/0236471 A1* 7/2020 Zou ...................... H04R 19/005
2020/0351595 A1 11/2020 Rusconi Clerici Beltrami et al.
2020/0382876 A1 12/2020 Cerini et al.
2021/0051413 A1 2/2021 Hui et al.
2021/0067880 A1 3/2021 Cheng et al.
2021/0084423 A1 3/2021 Rusconi Clerici Beltrami et al.
2021/0120346 A1 4/2021 Hui et al.
2021/0136483 A1 5/2021 Hsieh et al.
2021/0385584 A1 12/2021 Goswami et al.
2022/0073342 A1 3/2022 Ho et al.
2022/0267141 A1 8/2022 Chen et al.
2022/0272459 A1 8/2022 Chen et al.
2022/0332568 A1 10/2022 Barsukou
2022/0390310 A1* 12/2022 Wu ........................... G01L 9/08
2022/0402752 A1 12/2022 Goswami et al.
2023/0007405 A1 1/2023 Qian et al.
2023/0011561 A1 1/2023 Qian et al.
2023/0012046 A1 1/2023 Qian et al.
2023/0039743 A1 2/2023 Hui et al.
2023/0072672 A1 3/2023 Chen et al.
2023/0104257 A1 4/2023 Barsukou et al.
2023/0105699 A1 4/2023 Chen et al.
2023/0127983 A1 4/2023 Chen et al.
2023/0188896 A1 6/2023 Barsukou
2023/0234837 A1 7/2023 Chen et al.
2023/0239641 A1 7/2023 Chen et al.
2024/0098426 A1 3/2024 Barsukou

FOREIGN PATENT DOCUMENTS

JP 2008118639 A 5/2008
JP 2019140638 A 8/2019
KR 101058475 B1 8/2011

OTHER PUBLICATIONS

Chen et al., "Edge-released, piezoelectric MEMS acoustic transducers in array configuration," J. Micromech. Microeng. 22 (2012) 025005, pp. 1-9.
Huang et al., "High Sensitivity and High S/N Microphone Achieved by PZT Film with Central-Circle Electrode Design" IEEE, Mems 2017, Las Vegas, NV, USA, Jan. 22-26, 2017, pp. 1188-1191.
Je et al., "In situ tuning of a MEMS microphone using electrodeposited nanostructures," Journal of Micromechanics and Microengineering, 19 (2009) 035015, pp. 1-8.
Je et al., "MEMS Capacitive Microphone with Dual-Anchored Membrane", Proceedings 2017, 1, 342; Aug. 9, 2017.
Knisely et al., "Method for Controlling Stress Gradients in PVD Aluminum Nitride", Journal of Micromechanics and Microengineering, vol. 28, No. 11, 2018.
Littrell, "High Performance Piezoelectric MEMS Microphones", A dissertation submitted in partial fulfillment of the requirements for the degree of Doctor of Philosophy (Mechanical Engineering) in The University of Michigan, 2010, 111 pages.
Lo et al., "Development of a No-Back-Plate SOI MEMS Condenser Microphone," IEEE, Transducers 2015, Anchorage, Alaska, Jun. 21-25, 2015, pp. 1085-1088.
Lo et al., "Sensitivity Improvement of No. Back-Plate MEMS Microphone Using Polysilicon Trench-refilled Process," IEEE, Transducers 2017, Kaohsiung, Taiwan, Jun. 18-22, 2017, pp. 1171-1174.
Mohamad et al., "Modelling and Optimisation of a Spring-Supported Diaphragm Capacitive MEMS Microphone", Engineering, 2010, 2, 762-770.
Peña-García et al., "Design and Modeling of a MEMS Dual-Backplate Capacitive Microphone with Spring-Supported Diaphragm for Mobile Device Applications," Sensors (2018), 18, 3545, 30 pages.
Pulskamp et al. "Mitigation of residual film stress deformation in multilayer microelectromechanical systems cantilever devices." Journal of Vacuum Science & Technology B: Microelectronics and Nanometer Structures Processing, Measurement, and Phenomena 21.6 (2003): 2482-2486.
Segovia-Fernandez et al., "Monolithic Piezoelectric Aluminum Nitride MEMS-CMOS Microphone", IEEE (2017), Transducers 2017, Kaohsiung, Taiwan, Jun. 18-22, 2017, pp. 414-417.
Shah et al., "Design Approaches of MEMS Microphones for Enhanced Performance", Hindawi, Journal of Sensors, vol. 2019, Article ID 9294528, Mar. 6, 2019, 26 pages.
Udvardi et al., Spiral-Shaped Piezoelectric MEMS Cantilever Array for Fully Implantable Hearing Systems. Micromachines (2017) 8, 311, 13 pages.
Williams et al., "An AIN MEMS Piezoelectric Microphone for Aeroacoustic Applications", Journal of Microelectromechanical Systems, vol. 21, No. 2, Apr. 2012, pp. 270-283.
Yamashita et al., "Diaphragm deflection control of piezoelectric ultrasonic microsensors for sensitivity improvement", Sensors and Actuators A 139 (2007), pp. 118-123.
Yan et al., "Corrugated Diaphragm for Piezoelectric Microphone", IEEE, 1996, pp. 503-506.

* cited by examiner

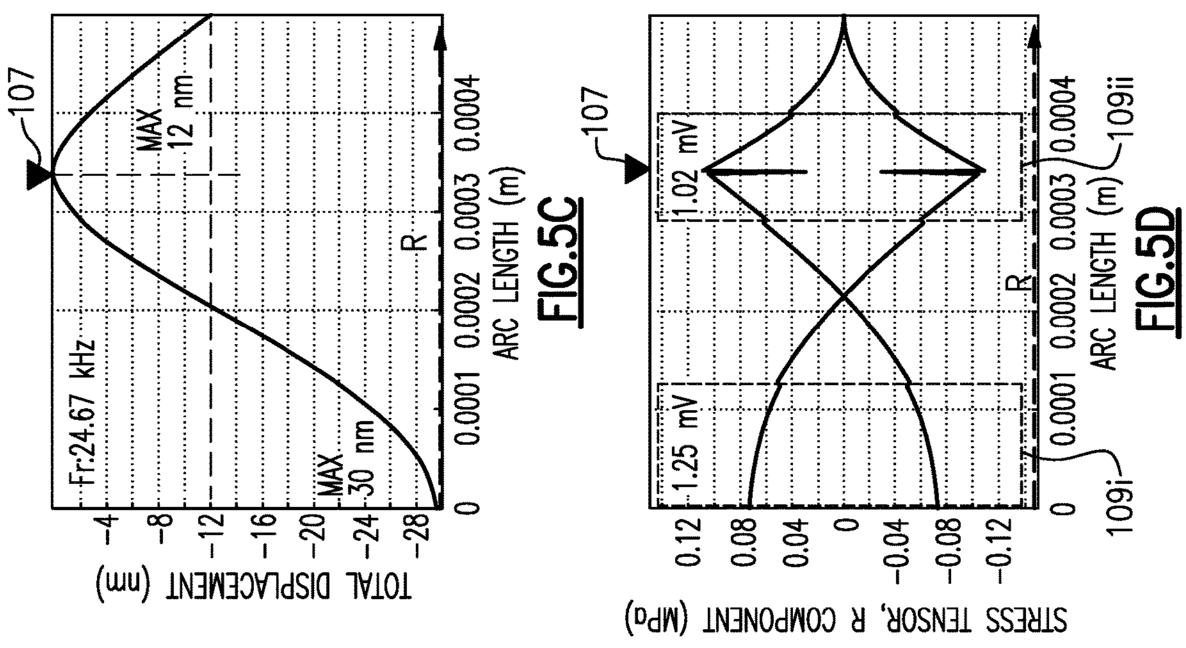
Fr:24.67 kHz
MAX 30 nm
MAX 12 nm
107
R
TOTAL DISPLACEMENT (nm)
ARC LENGTH (m)
FIG.5C
1.25 mV
1.02 mV
107
109i
109ii
R
STRESS TENSOR, R COMPONENT (MPa)
ARC LENGTH (m)
FIG.5D
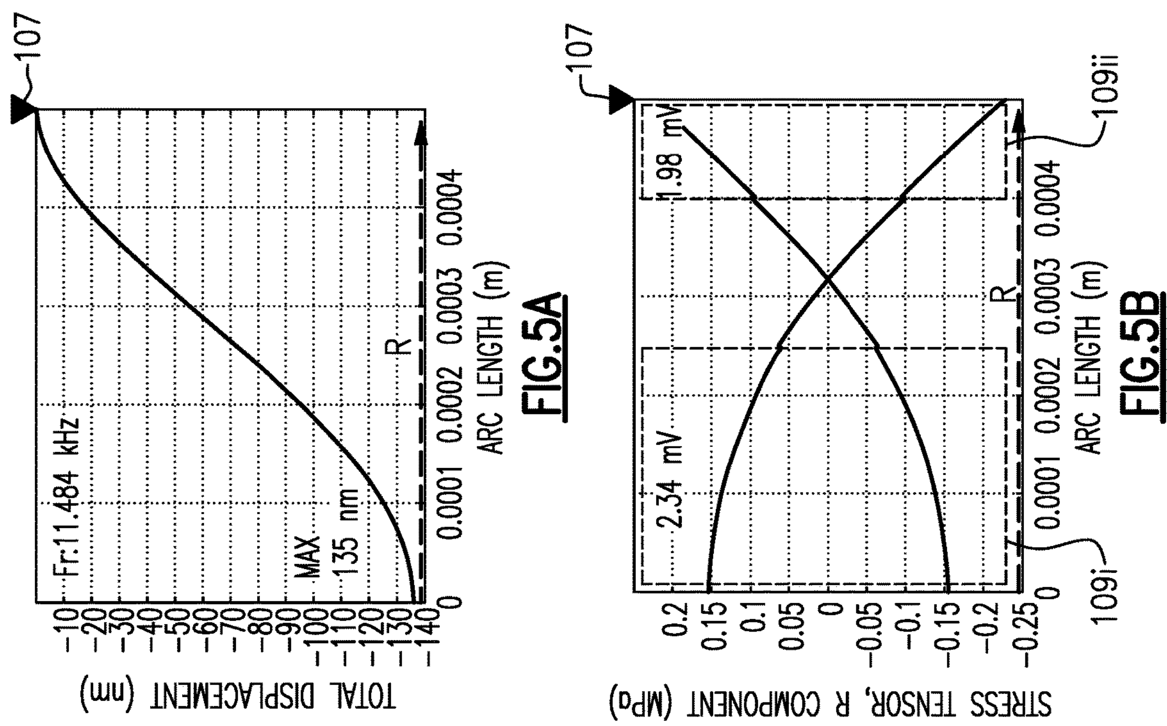
Fr:11.484 kHz
MAX 135 nm
107
R
TOTAL DISPLACEMENT (nm)
ARC LENGTH (m)
FIG.5A
2.34 mV
1.98 mV
107
109i
109ii
R
STRESS TENSOR, R COMPONENT (MPa)
ARC LENGTH (m)
FIG.5B 831
801
807

MECHANICALLY COUPLED PIEZOELECTRIC MEMS MICROPHONE

CROSS-REFERENCE TO RELATED APPLICATIONS

This application claims priority under 35 U.S.C. § 119(e) to U.S. Provisional Patent Application Ser. No. 63/269,950, titled "A MECHANICALLY COUPLED PIEZOELECTRIC MEMS MICROPHONE," filed Mar. 25, 2022, the entire content of which is incorporated herein by reference for all purposes.

FIELD

Aspects and embodiments disclosed herein relate to piezoelectric microelectromechanical systems microphones with sensors.

DESCRIPTION OF THE RELATED TECHNOLOGY

A microelectromechanical system (MEMS) microphone is a micro-machined electromechanical device used to convert sound pressure (e.g., voice sound) to an electrical signal (e.g., voltage). MEMS microphones are widely used in mobile devices, headsets, smart speakers and other voice-interface devices or systems. Conventional capacitive MEMS microphones suffer from high power consumption (e.g., large bias voltage) and reliability, for example, when used in a harsh environment (e.g., when exposed to dust and/or water).

Piezoelectric MEMS microphones have been used to address the deficiencies of capacitive MEMS microphones. Piezoelectric MEMS microphones offer a constant listening capability while consuming almost no power (e.g., no bias voltage is needed), are robust and immune to water and dust contamination.

Piezoelectric MEMS microphones work on the principle of piezoelectric effect, so that they convert acoustic signals to electric signals when sound waves vibrate the piezoelectric sensor. The sound waves bend the piezoelectric film layers of a cantilevered sensor or a membrane sensor, causing stress and strain, resulting in charges being generated in the piezoelectric film layers. The charges are converted to voltage as an output signal, by the placement of one or more electrodes on the piezoelectric film layers.

SUMMARY

According to one embodiment there is provided a piezoelectric microelectromechanical systems microphone comprising a sensor including at least one piezoelectric layer, at least one constraint in contact with the sensor at a position, such that the sensor is supported by the at least one constraint, and such that the sensor that the sensor has a membrane region to one side of the at least one constraint and a cantilevered region to the other side, and a cavity defined at least partially by the at least one constraint.

In one example the membrane region and the cantilevered region are mechanically coupled in the radial direction In one example the sensor is circular.

In one example the at least one constraint forms an annulus whose center is the center of the sensor.

In one example the membrane region is circular, and the cantilevered region is a disc located around the outer edge of the membrane region.

In one example the microphone comprises multiple constraints.

In one example each of the multiple constraints are annular sectors of a circle and are separated by a plurality of air gaps such that air can flow from underneath the membrane region to underneath the cantilevered region.

In one example the at least one constraint has a height of between about 1 to about 5 micrometers.

In one example the at least one constraint has a width of between about 1 to about 5 micrometers.

In one example the at least one constraint comprises an upper constraint and a lower constraint.

In one example the upper constraint is mechanically in contact with the upper side of the sensor, and the lower constraint is mechanically in contact with the lower side of the sensor.

In one example the upper constraint is mechanically and electrically in contact with the upper side of the sensor, and the lower constraint is mechanically and electrically in contact with the lower side of the sensor.

In one example the upper constraint and lower constraint are not in line with each other.

In one example the upper constraint and lower constraint are located at the same radius of the sensor, such that they are in line with each other.

In one example the upper and lower constraints are silicon.

In one example the at least one constraint substantially eliminates movement of the sensor at the radius of the at least one constraint.

In one example the sensor has a diameter of about 1 mm.

In one example the at least one constraint is located about 0.3 to about 0.4 mm from the center of the sensor.

In one example the microphone further comprises at least two electrode layers.

In one example each of the at least two electrode layers are separated into two electrodes, such that there is an inner and outer electrode.

In one example the inner electrode is located at the center of the membrane portion.

In one example the inner electrode has a radius of between about 0.01 mm and about 0.015 mm.

In one example the outer electrode is located at the at least one constraint.

In one example the outer electrode is an annulus centered at the center of the sensor.

In one example the outer electrode has a width such that the outer electrode covers a portion of the membrane region and a portion of the cantilevered region.

In one example the outer electrode has a width of about 0.1 mm.

In one example the outer electrode covers about 0.05 mm of the outer edge of the membrane region and about 0.05 mm of the inner edge of the cantilevered region.

In one example the microphone comprises two piezoelectric layers.

In one example the microphone comprises three electrodes.

In one example the two piezoelectric layers and three electrodes are alternated, such that there is an upper, middle, and lower electrode layer.

In one example the upper and lower electrode layers are separated into two electrodes, such that each of the upper and lower electrode layers have an inner and outer electrode.

In one example the middle electrode layer is a single electrode.

In one example the middle electrode extends across the whole membrane region, and extends across a portion of the cantilevered region.

According to another embodiment there is provided a method of forming a piezoelectric microelectromechanical systems microphone, the method comprising forming a sensor from at least one piezoelectric layer, forming at least one constraint on the sensor, such that the at least one constraint is fixed to the upper side and lower side of the sensor, and is located away from the edge of the sensor.

In one example, forming the sensor comprises depositing two piezoelectric layers and three electrodes, such that the electrodes and piezoelectric layers alternate.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures:

FIG. 5A is a graph showing displacement of a known sensor;

FIG. 5B is a graph showing stress of a known sensor;

FIG. 5C is a graph showing displacement of a sensor according to aspects of the present disclosure;

FIG. 5D is a graph showing stress of a sensor according to aspects of the present disclosure;

DETAILED DESCRIPTION

Aspects and embodiments described herein are directed to a piezoelectric microelectromechanical systems (MEMS) microphone with a reduced compliance, an increased performance, and improved resistance to damage responsive to exposure to external sound pressure than a conventional MEMS microphone.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Figure 1A:
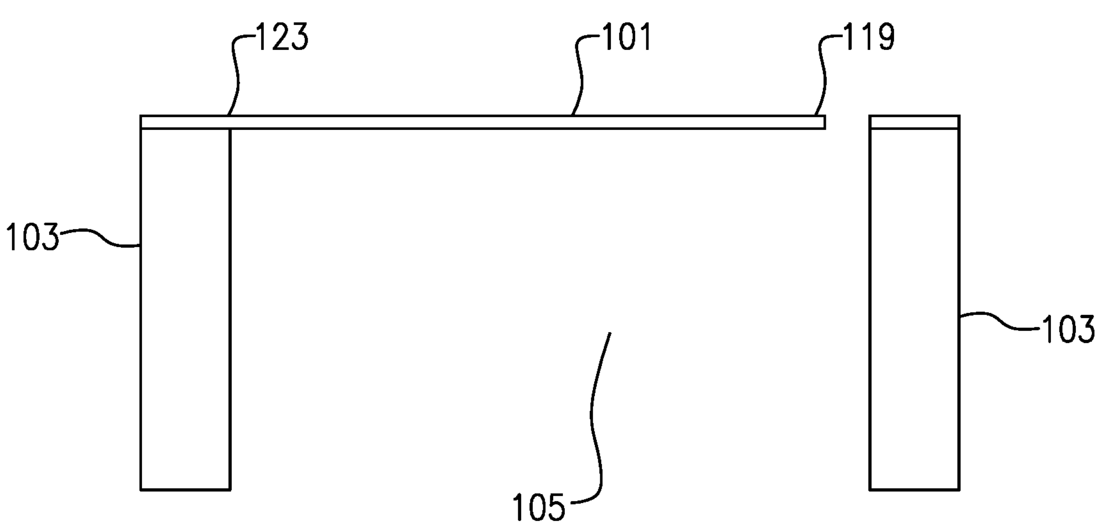
FIG. 1A is a known cantilevered sensor.
Figure 1B:
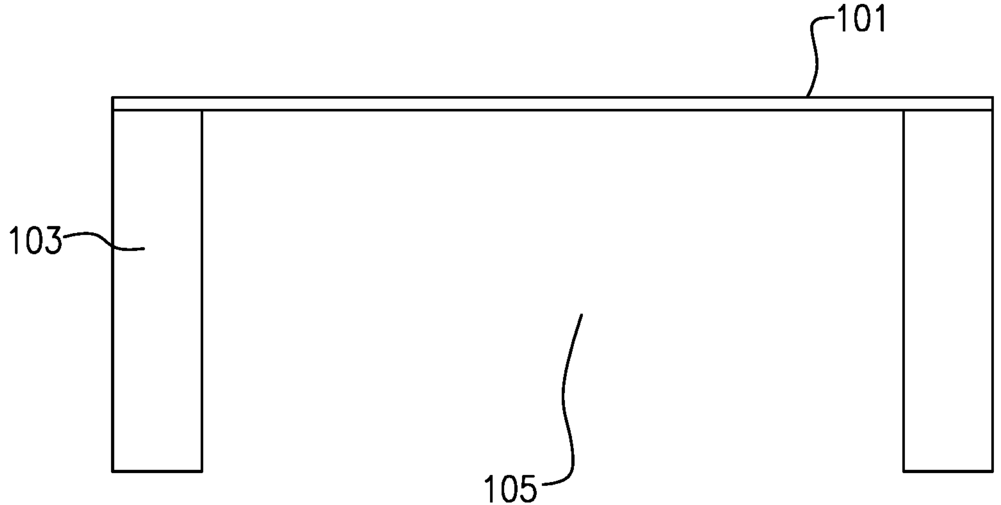
FIG. 1B is a known cantilevered membrane.

FIGS. 1A and 1B show cross-sectional views of a known implementation of a piezoelectric microelectromechanical systems (MEMS) microphone 100 (hereinafter the "microphone").

FIG. 1A shows a cross-sectional view of a cantilever microphone 100. The microphone 100 comprises a substrate. The substrate is optionally made of silicon. The substrate has side walls 103, arranged such that they extend perpendicular to the length of the sensor 101. The microphone comprises a cavity 105 defined by the side walls 103. The microphone may comprise one or more sensors. The sensor 101 is composed of at least one piezoelectric layer, and two electrodes, e.g., a signal and a ground electrode, which are not shown in this simplified illustration. The microphone comprises an anchor region at which the sensor 101 is coupled to and supported by one of the side walls 103. The sensor 101 is supported by the substrate at the anchor region, such that the sensor 101 is cantilevered and extends between a fixed end 123 and a free end 119. Although the microphone is illustrated with one cantilevered sensor 101, such that the sensor extends across the cavity 105, and is separated from the second substrate wall by a gap, it will be appreciated that in other embodiments, there may be two cantilevered sensors extending from opposite walls, such that the free end of one cantilevered sensor is separated from the free end of the second cantilevered sensor by a gap centered over the cavity 105. The size of the gap between the free ends of the one or more sensor is preferably minimized, such that air flow into and out of the cavity is minimized, thus increasing sensitivity of the device.

FIG. 1B shows a cross-sectional view of a microphone with a membrane sensor 101. As described above, there may be one or more substrate walls 103, defining a cavity 105. The sensor 101 is supported by the one or more substrate walls 103, such that the sensor extends across the top of the cavity 105 and does not comprise a free end. The membrane sensor 101 is therefore limited in how much it can bend into and out of the cavity 105.

It has been appreciated that a cantilever sensor has the advantage of being free from residual stress, and also has a higher achievable linearity than a membrane sensor of comparable size and materials. However, the cantilever sensor has a smaller sensitivity than the membrane sensor of comparable size and materials.

It has also been appreciated that the membrane sensor has the advantage of having a high sensitivity. However, it has a larger compliance and acoustic resistance than a cantilever sensor of comparable size and materials.

Aspects and embodiments as described herein provide a new sensor structure. A mechanically coupled membrane-cantilever structure is described herein, which has the advantages of both of membrane and cantilever sensors.

Figure 2A:
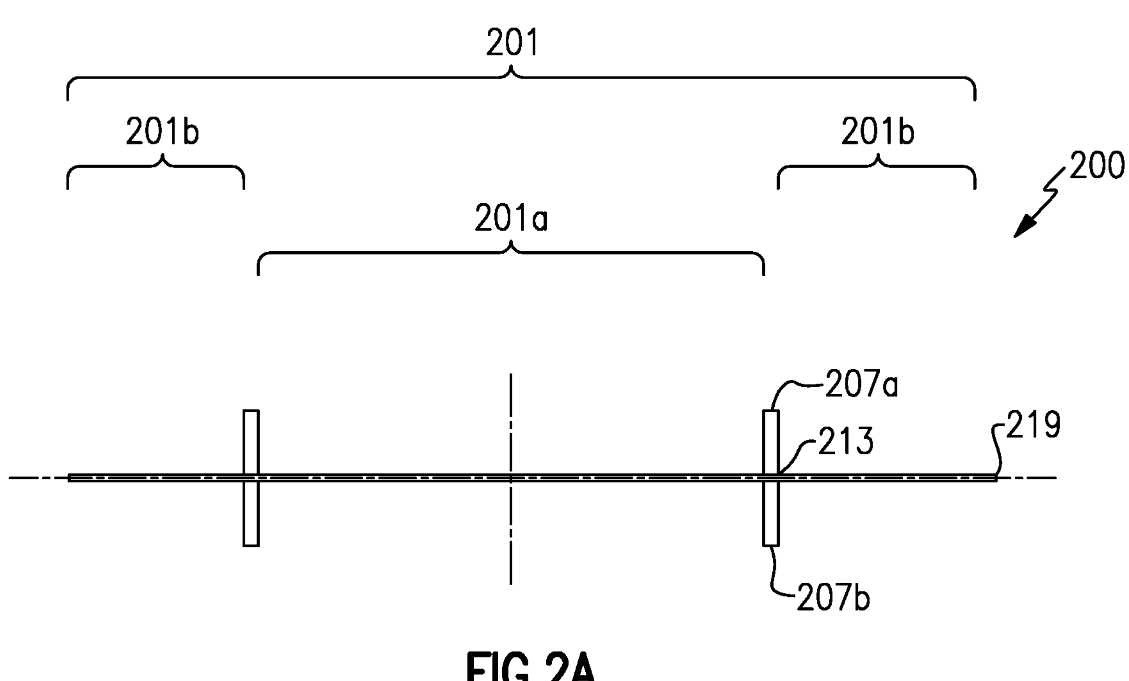
FIG. 2A is a cross-sectional view of a sensor according to aspects of the present disclosure.

FIG. 2A shows a cross-sectional view of a system 200, comprising a sensor 201 and upper and lower constraints 207*a*, 207*b*, together or separately referred to as constraint 207, according to an embodiment of the present disclosure. The system 200 comprises a sensor 201, wherein the sensor comprises at least one piezoelectric layer. The system comprises at least one constraint 207 in contact with the sensor. The constraint performs the function of supporting the sensor and constrains movement of the sensor at the supported position. The constraint can be considered as a support but is referred to herein as a "constraint." The system 200 may comprise one constraint, which may be fixed to the sensor from one side, such that it minimizes movement of the sensor at the location of the constraint. In the embodiment illustrated in FIG. 2A the system comprises two constraints, an upper constraint 207*a* and a lower constraint 207*b*, such that the upper side of the sensor 201 is in contact with the upper constraint 207*a*, and the lower side of the sensor 201 is in contact with the lower constraint 207*b*. The lower constraint 207*b* supports the sensor. The upper constraint and lower constraint are located at the same radius of the sensor, such that they are in line with each other, i.e., they the upper and lower constraints are at the same positions in lateral direction from the center of symmetry, wherein the lines of symmetry are shown by the dashed lines. The system 200 may be symmetrical, as illustrated by the dashed lines, such that in the plan view the sensor 201 is circular, and such that the upper 207*a* and lower 207*b* constraints are exactly the same width and height and are located at the same radius on the sensor. In some embodiments, the upper and lower constraints may not be in line with each other. In such embodiments, the upper constraint may have an annular shape with a first radius centered around the center of the sensor, and the lower constraint may have an annular shape of a second radius, wherein the first and second radii are different. Therefore, the sensor and constraints will have a center of symmetry in the plane parallel to the surface of the sensor. The constraint (s) may be any shape suitable for supporting the sensor. In some embodiments the one or more constraints are pillars which do not extend around the entirety of the membrane region, such that in packaging, as later described, air may move around the constraint. In some embodiments there are multiple upper constraints, and multiple lower constraints, such that there are radii of the sensor which are not in contact with a constraint. In such embodiments, the constraint may be a pillar with a circular cross-section. The constraint(s) may be composed of a dielectric material, such as silicon, silicon dioxide, aluminum nitride, or zinc oxide. Alternatively, the constraint may be composed of a metal if suitable electrical separation is provided, for example, aluminum, ruthenium, or titanium. The location, material, and structure of the constraint is optimized to result in the best performance of the sensor. The compliance of the constraint will also affect the overall performance of the MEMS microphone in which the sensor is used.

The sensor has a membrane region 201*a* and at least one cantilevered region 201*b*. The cantilevered region is the outer part of the sensor, defined by the radius of the sensor which is on the outside of the one or more constraints. The cantilevered region of the sensor is supported by the one or more constraints, and the cantilevered region has a fixed end 213 adjacent the one or more constraints, and a free end 219 away from the one or more constraints. The cantilevered region is therefore free to deflect in response to acoustic pressure. The membrane region 201*a* is the part of the sensor which is on the inside of the one or more constraints, such that the membrane region 201*a* is fixed around its exterior. The membrane region therefore has no free end.

The cantilevered region, acts substantially like a cantilevered sensor, as described in FIG. 1A. The membrane region of the sensor acts substantially like a membrane sensor, as described in FIG. 1B. The sensor of the embodiments described herein is better at withstanding high sound pressure than the known membrane sensor. This is due to the cantilevered region being stronger than a known membrane sensor, as it is able to deflect more in response to acoustic pressure, whereas a membrane sensor may break at high acoustic pressures. The sensor of embodiments herein allows the acoustic pressure to be spread between the cantilevered and membrane regions, such that sensor is stronger than a known membrane sensor. It will be appreciated that the general concept and some embodiments are discussed here, however, the design of a particular sensor may depend on the implementation or desired performance. Additional features may be applied to the sensors as described herein. For example, the sensor may comprise all or some of additional piezoelectric layers, additional electrode layers, additional slit lines on the sensor, and optimized cavity shape and size. These additional features will have mechanical and/or acoustic effects on the sensor structure, and therefore may be used to optimize the sensor for the desired performance or application.

Figure 2B:
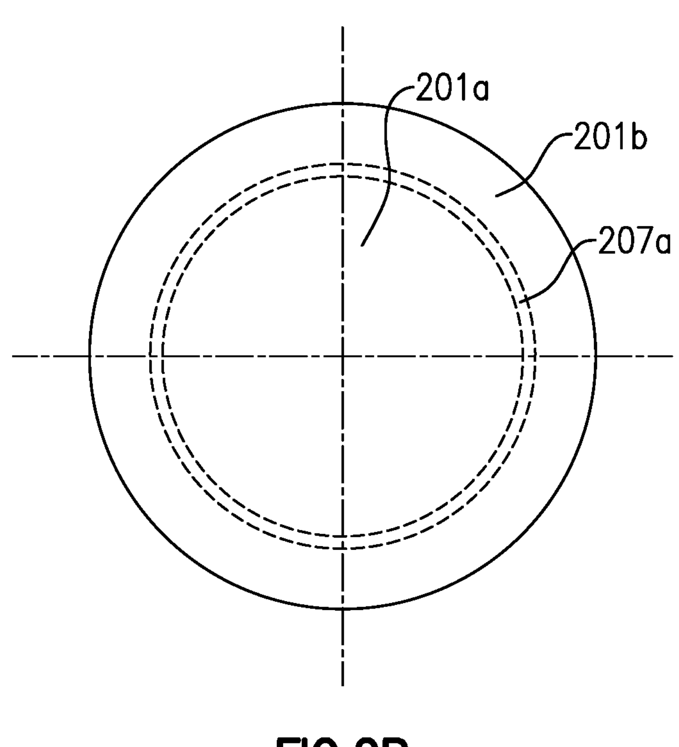
FIG. 2B is a plan view of a sensor according to aspects of the present disclosure.

FIG. 2B shows a plan view of the system 200, as described in FIG. 2A. The area of sensor in contact with the one or more constraints is shown by the circular dashed lines. In this embodiment, the sensor is circular, as shown by the lines of symmetry indicated by the straight dashed lines, and the area of the sensor in contact with the one or more constraints forms an annulus whose center is the center of the sensor. The upper and lower constraints 107*a* and 107*b* are each an annulus, with no gaps. The membrane region is circular in shape, and the cantilevered region is a disc located around the outer edge of the membrane region. The cantilevered region and membrane region are separated by the one or more constraints. In an embodiment comprising an upper and lower constraint, the sensor is sandwiched between the upper and lower constraints. The constraints substantially eliminate movement of the sensor at the area in which the sensor is in contact with the constraints. The cantilevered region acts like a conventional cantilevered sensor, as it is fixed at one end, at the constraint, and is free to move at its other end. Therefore, the cantilevered region of aspects and embodiments disclosed herein may deflect in response to an acoustic pressure, as in a conventional sensor. The sensor as described in embodiments herein is free from residual stress at the free lateral boundaries, i.e., the free end of the cantilevered region. Therefore, the sensor performance will not degrade due to stress residual.

The upper 207*a* and lower 207*b* constraints may be composed of silicon. In the embodiment of FIGS. 2A and 2B, the sensor may have a diameter of about 1000 micrometers, and the constraints may be located about 0.3 mm to about 0.4 mm from the center of the sensor. Therefore, the membrane region has a radius of about 0.3 mm to about 0.4 mm. The constraint has a width of between about 1 to about 5 micrometers, and a height of between about 1 to about 5 micrometers.

Figure 3A:
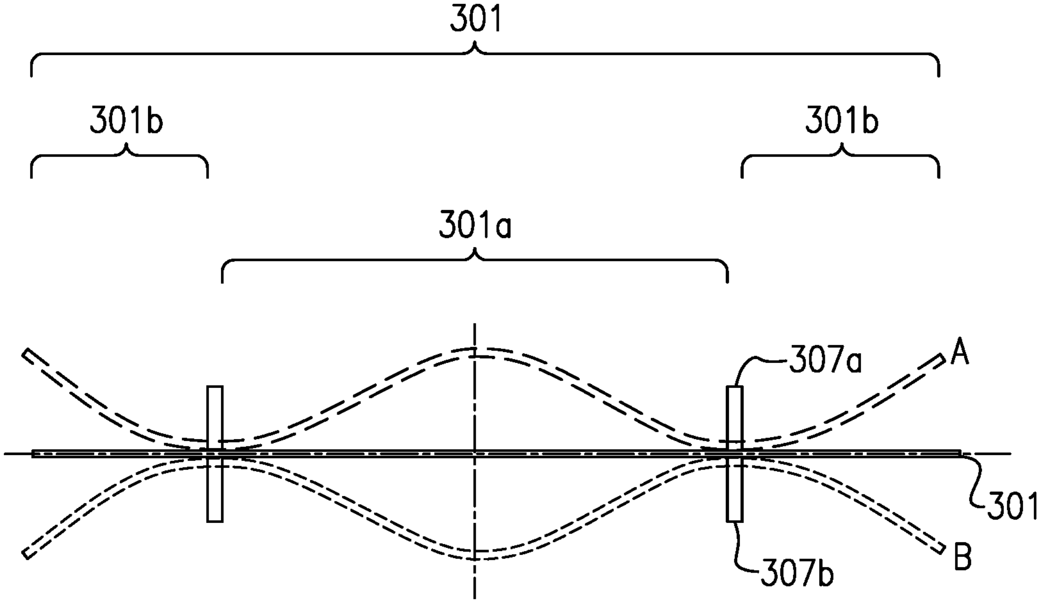
FIG. 3A is a cross-sectional view of deflection of a sensor according to aspects of the present disclosure.

FIG. 3A shows a cross-sectional view of the deflection of a sensor with constraints according to an embodiment disclosed herein. The sensor 301 comprises a membrane region 301*a*, a cantilevered region 301*b*, and one or more constraints 307 (307*a* and 307*b* in FIG. 3A), as described herein. In response to a force, e.g., an acoustic pressure, from the underside of the microphone, the sensor deflects in an upwards direction, as shown by the dashed line labelled A. In response to an acoustic pressure from the upper side of the microphone, the sensor deflects in a downwards direction, i.e., into the cavity, as shown by the dashed line labelled B. The cantilevered and membrane regions deflect in the same direction in response to a force. The deflection of the sensor in the upwards and downwards direction may be substantially the same shape and magnitude, as shown by the lines of symmetry shown by the vertical and horizontal dashed lines in FIG. 3A. The deflection of the sensor creates a stress, due to the bending of the piezoelectric layer. This produces a charge, due to the piezoelectric effect. As the sensor is constrained by the constraint 307, the piezoelectric layer has regions of charge generation adjacent the upper and lower constraints, and at the center of the sensor. It will be appreciated that there may be stress and charge generation elsewhere on the sensor, however, the charge per area at these sections is lower, as will be described herein. Therefore, the sensor may comprise at least two electrodes at which the charge is collected.

Figures 3B, 3C:
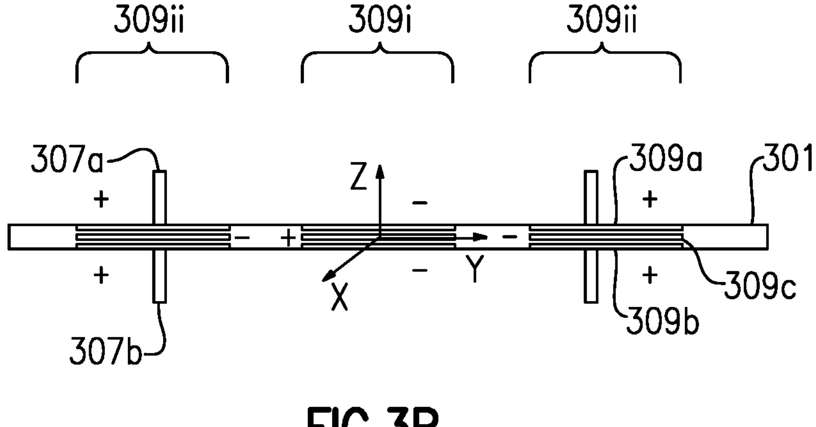
FIG. 3B is a cross-sectional view of a sensor according to aspects of the present disclosure.
FIG. 3C is a cross-sectional view of a sensor according to aspects of the present disclosure.

FIGS. 3B and 3C show cross-sectional views of two sensors with constraints according to embodiments of the present disclosure. The sensor in each of these embodiments comprises three electrodes and two piezoelectric layers. However, for simplicity, the two piezoelectric layers are not shown in the figures. There is an upper 309*a*, lower 309*b*, and middle 309*c* electrode layer. The first piezoelectric layer is located between the upper and middle electrode layers, and the second piezoelectric layer is located between the middle and lower electrode layers. Therefore, the electrode layers and piezoelectric layers are alternated. The upper and lower electrode layers collect charge created on the piezoelectric layers due to bending of the sensor. The middle electrode layer acts as a ground.

In the embodiment shown in FIG. 3B, each of the upper 309*a*, lower 309*b*, and middle 309*c* electrodes have an inner 309*i* and outer 309*ii* electrode. The inner electrode 309*i* is centered on the center of the membrane region, i.e., the center of the sensor 301. The inner electrode is therefore circular in embodiments in which the sensor 301 is circular. The outer electrode is an annulus, wherein the annulus is centered at the center of the sensor. The outer electrode has a width such that the outer electrode covers a portion of the membrane region and a portion of the cantilevered region. Preferably, the outer electrode covers substantially the same widths of the portion of the membrane region and the portion of the cantilevered region. The inner and outer electrodes of each of the upper, middle, and lower layers are separate, such that they are not in contact with each other. The charges generated on the electrodes are shown in FIG. 3B. As shown, the inner electrode and outer electrodes have opposite charges at each of their respective layers. The outer electrode 309*ii* may not cover the entire cantilevered region, such that the free end of the cantilevered region does not have an electrode. This is preferable, as the charge generated on the cantilevered portion is largest adjacent the one or more constraints. The size and shape of the electrode is optimized to provide the maximum output energy. Although not shown in FIG. 3B, the sensor and constraints are symmetrical, having the same lines of symmetry as shown in FIGS. 3A and 3C.

The inner electrode and outer electrode combined do not cover the entire membrane region, such that there is a section of membrane region where there is no electrode. As described above, the stress, and therefore charge, is greatest at the center of the membrane and at the region of membrane adjacent the one or more constraints.

The embodiment illustrated in FIG. 3C comprises the same features as FIG. 3B, except in this embodiment the middle electrode layer extends across the entire membrane, such that the inner 309*i* and outer electrodes 309*ii* are connected in the middle electrode layer 309*c*. The inner 309*i* and outer 309*ii* upper 309*a* and lower 309*b* electrode layers are separated, as described with respect to FIG. 3B. The upper 309*a* and lower electrode 309*b* layers may be connected at the inner electrode 309*i*. The outer electrodes 309*ii* of the upper 309*a* and lower 309*b* layers may be connected to the ground. The lines of symmetry are shown by the dashed lines.

Figure 4:
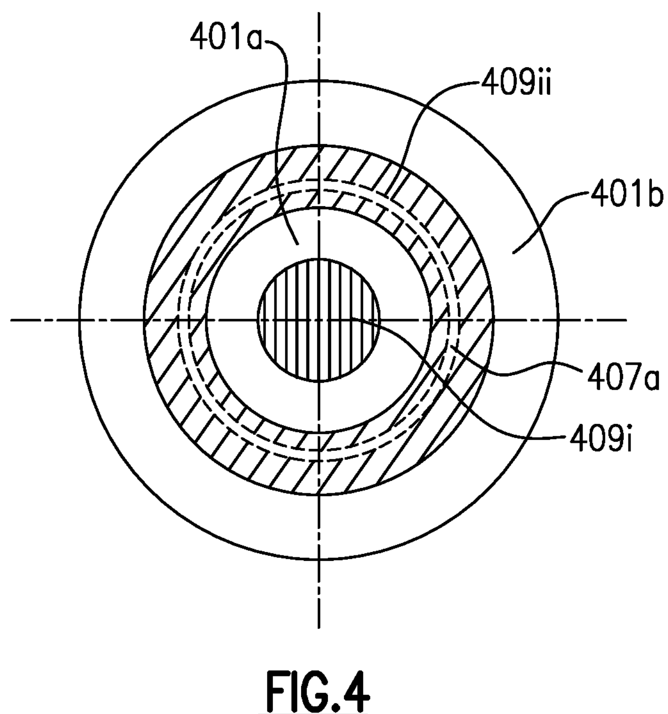
FIG. 4 is a plan view of a sensor according to aspects of the present disclosure.

FIG. 4 shows a plan view of a sensor and constraint according to another embodiment of the present disclosure. In this embodiment, the sensor is circular, as shown by the lines of symmetry indicated by the straight dashed lines, and the area of the sensor in contact with the one or more constraints forms an annulus whose center is the center of the sensor. In this embodiment, the inner 409*i* and outer 409*ii* electrodes are circular. The area of the sensor in contact with the one or more constraints, shown by the upper constraint 407*a*, is circular. The upper and/or lower constraints may be continuous, such that they form a complete ring between the membrane and cantilevered regions. In other embodiments, as described herein, there may be multiple upper and lower constraints, such that there are air gaps between the multiple constraints. As shown, the one or more constraints are located around the middle of the outer electrode. The membrane region is circular, and the cantilevered region is an annulus located around the outer edge of the membrane region.

FIGS. 5A-5D show mechanical parameters of a known sensor compared to mechanical parameters of a sensor according to an embodiment of the present disclosure. The parameters are calculated from a theoretical finite element method (FEM) model, wherein the sensor has a radius of 500 micrometers, the piezoelectric layers each have a thickness of 200 nanometers, the electrode layers each have a thickness of 30 nanometers, the piezoelectric layers are formed from Sc(0.18)AlN, and the electrode layers are Al. The force exerted on the sensors is 1 Pa.

FIG. 5A and FIG. 5B show the change in displacement and the stress tensor with radius of a known membrane sensor.

FIG. 5A shows the displacement of a known membrane sensor, wherein the membrane sensor is fixed around its perimeter such that there is no displacement around the edge of the membrane. The arc length is 0 nm at the center of the membrane sensor, and the membrane is supported by the substrate wall at 107, which may be equated to the constraint (s) of the embodiments disclosed herein. At the constraint region 107 of the known sensor, there is no displacement. The displacement is maximum at the center of the sensor. The known membrane sensor modelled here, has a maximum displacement of about −135 nm. It will be appreciated that the displacement may be positive if the acoustic force is exerted from the other side of the membrane. The decreasing of the displacement along the radius of the membrane is substantially constant. The resonant frequency of the known membrane sensor of FIG. 5A is about 11.484 kHz.

FIG. 5B shows the radial component of the stress tensor of the same known membrane sensor as modelled in FIG. 5A. The locations of the inner 109*i* and outer 109*ii* electrodes are shown in FIG. 5B. As shown, the stress is maximum at the center of the membrane, arc length=0 nm, and at the edge of the membrane, adjacent the region 107 at which the membrane is fixed. As shown, there is a positive and negative stress, where the positive and negative stresses are equal in value and shape. The positive stress is due to the upper surface of the upper piezoelectric layer being strained when the sensor bends into the cavity, and the lower piezoelectric layer being compressed when the sensor bends into the cavity. Both the membrane and cantilevered regions have a negative and positive stress. The output voltage from the inner electrode 109*i* located on the membrane region of the sensor is 2.34 mV. The output voltage from the inner electrode 109*ii* located on the cantilevered region of the sensor is 1.98 mV.

FIGS. 5C and 5D show the change in displacement and the stress tensor with radius (arc length) of a sensor according to an embodiment of the present disclosure. The sensor modelled in FIGS. 5C and 5D is constrained by two constraints, whose radial location is shown as 107 on the graphs, as described herein. In reference to the graphs, the sensor comprises a membrane region to the left of the constraint 107, and the sensor comprises a cantilevered region on the right of the constraint 107. The constraint is located at about 0.00034-0.00033 m from the center of the membrane. It will be appreciated that the membrane is fixed by constraints around its exterior, as described in FIGS. 3A-3C. Therefore, as described in FIG. 3A, the membrane region will have a maximum displacement at its center, and the displacement will decrease towards the constraint 107 in all radial directions.

FIG. 5C shows the change in displacement with the radius (arc length) of the sensor. The membrane region of the sensor has a maximum displacement of −30 nm, at the center of the membrane, arc length=0 nm. It will be appreciated that the displacement may positive if the acoustic force is exerted from the other side of the membrane. The displacement decreases as the arc length increases. The displacement of the sensor is 0 nm at the constraints 107, as the sensor is fixed between two constraints, and therefore is unable to move vertically. The cantilevered region of the sensor has a maximum displacement of −12 nm. The cantilevered region and membrane region deflect in the same direction, as a result of acoustic pressure exerted on the sensor. The displacement of the sensor at the cantilevered region increases with an increase in arc length. The cantilevered region has a free end, as described in FIG. 2A, at which the displacement of the cantilevered region is the maximum. The sensor according to an embodiment of the present disclosure has a smaller compliance than the known sensor, for the same sensor area, as shown by the smaller displacement of the sensor according to an embodiment of the present disclosure.

FIG. 5D shows the radial component of the stress tensor of a membrane according to an embodiment of the present disclosure. The location of the constraint is shown by 107. As shown by the graph of FIG. 5D, there is a positive and negative stress resulting from the bending of the sensor, for the same reasons as described with reference to FIG. 5B. The membrane region has a maximum stress at the center of the sensor and adjacent the constraint 107. The cantilevered region has a maximum stress adjacent the constraint 107. The stress decreases away from the constraint. The inner electrode 109*i* is therefore located at the center of the sensor, and the outer electrode 109*ii* is located such that it covers the constraint and a portion of the membrane region and a portion of the cantilevered region adjacent the constraint. The inner electrode has an output voltage of 1.25 mV, and the outer electrode has an output voltage of 1.02 mV. Therefore, the output voltage of the sensor according to embodiments of the present disclosure is smaller than the output voltage than the known sensor. However, the sensor according to embodiments of the present disclosure has a much smaller compliance than the known sensor.

Figure 6B:
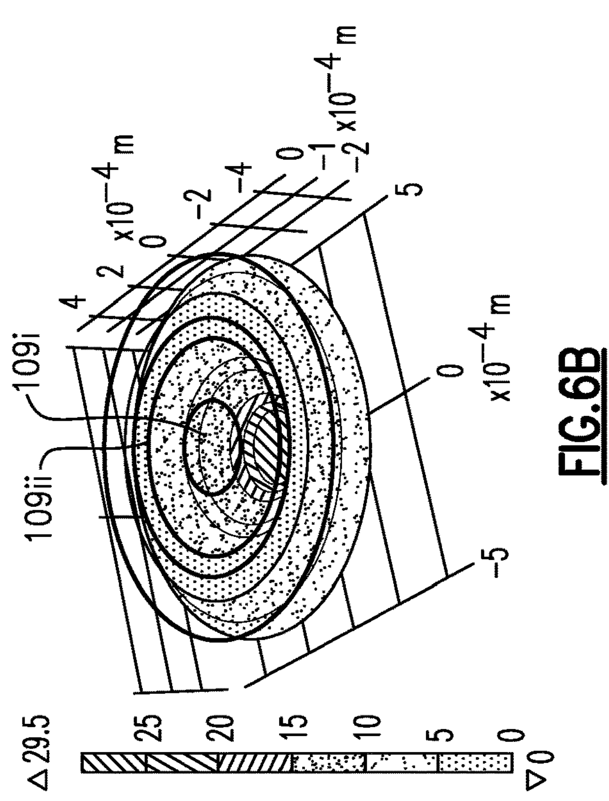
FIGS. 6B and 6C are two views of a model showing the shape and displacement of a sensor according to aspects of the present disclosure.
Figure 6C:
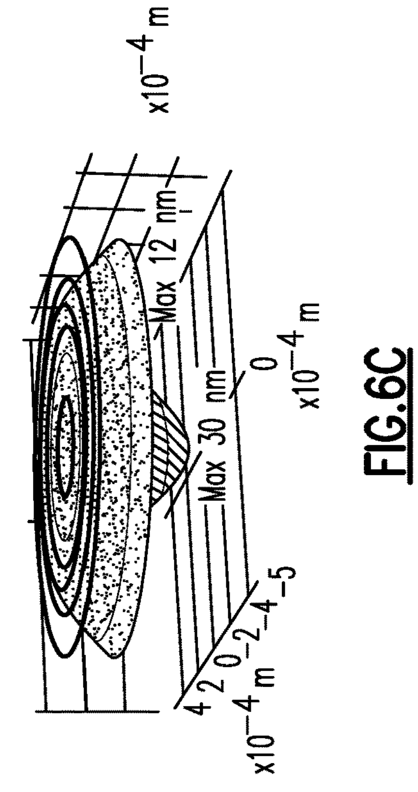
Figure 6A:
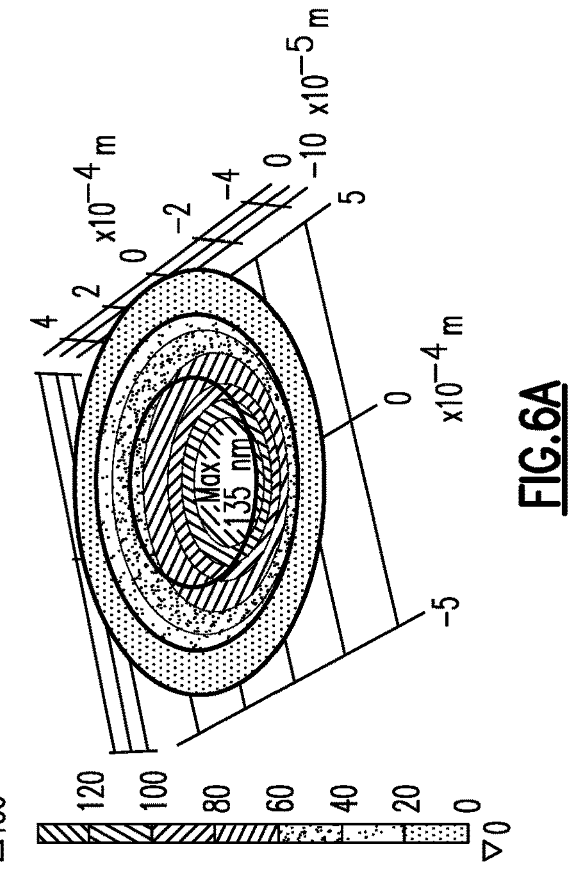
FIG. 6A is a model showing the shape and displacement of a known membrane sensor.

FIGS. 6A-6C are figures comparing the total displacement and shape of a known sensor and a sensor according to an embodiment of the present disclosure. The sensors are the same sensors modelled to obtain the results shown in FIGS. 5A-5D, and are under the same amount of force, and therefore the reader is invited to refer back to those figures for detailed displacement values of the two sensors. As described in relation to FIGS. 5A-5D, the parameters are calculated from a theoretical finite element method (FEM) model, wherein the sensor has a radius of 500 micrometers, the piezoelectric layers each have a thickness of 200 nanometers, the electrode layers each have a thickness of 30 nanometers, the piezoelectric layers are formed from Sc(0.18)AlN, and the electrode layers are Al. The force exerted on the sensors is 1 Pa. The location of the electrodes is shown by the circular lines, such that there is an inner and outer electrode on each sensor.

FIG. 6A shows the displacement and shape of a known membrane sensor, under 1 Pa/1 kHz sound pressure level. As shown, the maximum displacement is at the center of the membrane, and the displacement decreases towards the perimeter of the membrane sensor, where the membrane sensor is supported by the substrate wall, as illustrated in FIG. 1B. The maximum displacement of the sensor is 135 nm, as described in relation to FIGS. 5A-5B.

FIGS. 6B and 6C show different views of the shape and displacement of a sensor according to an embodiment of the present disclosure. As shown in FIGS. 6B and 6C, the maximum displacement of the membrane region is 30 nm at the center of the sensor. The displacement decreases towards the constraints, which are shown in FIGS. 5C and 5D. The displacement is 0 nm at the constraint region. The displacement increases with radius in the cantilevered region, and the maximum displacement of the cantilevered region is 12 nm. As shown in FIG. 6C, the cantilevered and membrane portions of the sensor bend in the same direction, which is in the same direction as the force exerted on the sensor. In this model, the force is exerted from the upper side of the sensor, and therefore the sensor bends downwards.

As shown in FIGS. 5C-5D and FIGS. 6B-6C, in the sensor according to embodiments of the present disclosure, the cantilevered region of the sensor has a compliance of about half of the compliance of the membrane region. The compliance of the membrane region may be reduced, and the compliance of the cantilevered region increased, by moving the one or more constraints towards the center of the sensor such that the area of membrane region is decreased, and the area of cantilevered region is increased. The constraint may also be moved away from the center of the sensor, such that the area of membrane region is increased, and the area of cantilevered region is decreased. It will be appreciated that the one or more constraints may be moved with respect to the sensor to optimize the compliance of each region. The optimization may be based on the actual sensor, for example, the materials used, or the radius or thickness of the sensor. Therefore, it will be appreciated that the location of the one or more constraints described here is not limiting and the constraint may be moved to a smaller or larger radial position on the sensor.

Figure 7A:
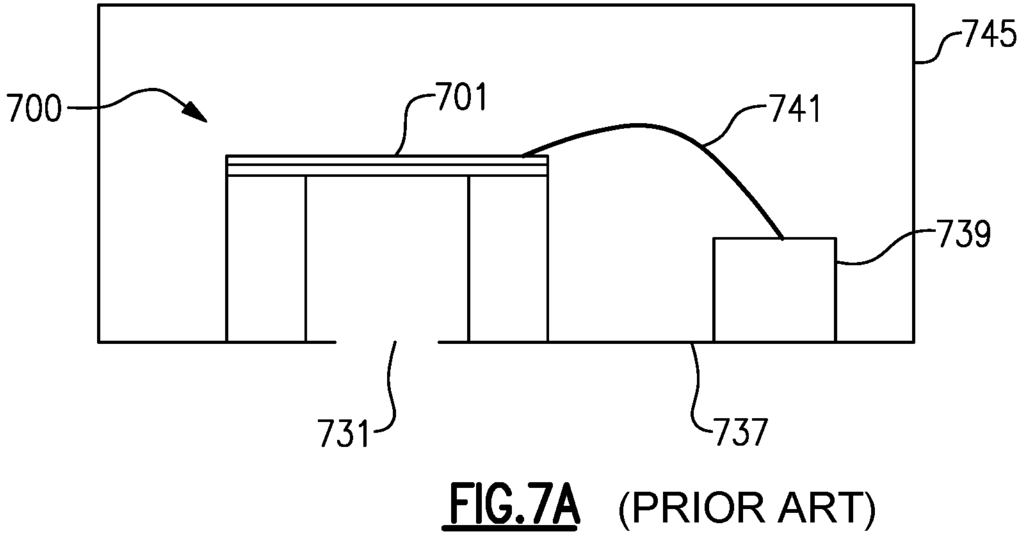
FIG. 7A is a cross-sectional view of a known microphone arrangement.

FIG. 7A shows a cross-sectional view of a microphone arrangement comprising a known membrane sensor. As illustrated, the microphone 700 of FIG. 7A is located within a cap 745. The cap may be flexible or rigid and may be any suitable material such as a metallic material. The cap creates a seal with a substrate 737 (for example, a printed circuit board), such that air only flows into and out of the arrangement via a sound inlet 731. The substrate 737 may be any suitable material. The cap 745 also mitigates electromagnetic interference. Sound waves enter the arrangement, causing the sensor 701 to bend and produce voltage due to the piezoelectric effect, as described herein. The arrangement comprises at least one solder pad such that the microphone arrangement may be soldered to external devices, not shown here. The microphone arrangement further comprises an application specific integrated circuit chip/die ("ASIC") 739. The MEMS microphone is electrically connected by wire bonding 741. Although not shown, it will be appreciated that the wire bonding may be connected to the one or more electrodes of the microphone, as described herein.

It will be noted that FIG. 7A is a cross-sectional view of the microphone arrangement, such that MEMS microphone 700, ASIC 739, and cap 745 extend into the page such that they are three-dimensional, as described in relation to other embodiments disclosed herein.

Figure 7B:
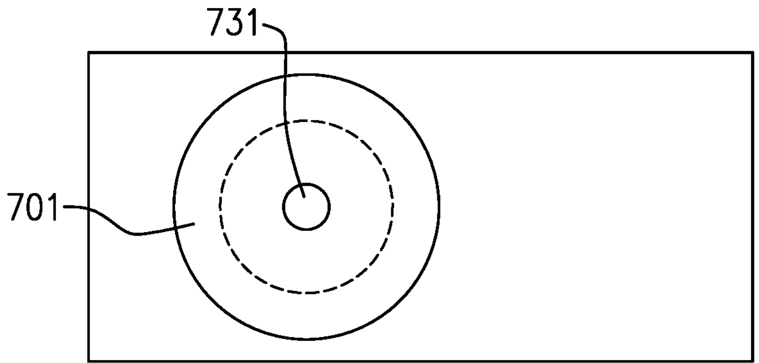
FIG. 7B is a plan view of a known microphone arrangement.

FIG. 7B shows a plan view of the microphone arrangement illustrated in FIG. 7A. The sound inlet may be circular, and the membrane may be circular. The substrate wall is shown by the dashed line, which may also be circular in shape.

Figures 8A, 8B:
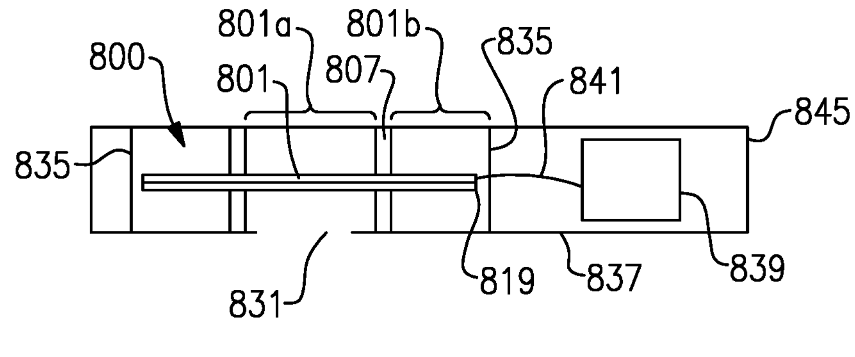
FIG. 8A is a cross-sectional view of a microphone arrangement in accordance with the present disclosure.
FIG. 8B is a plan view of a microphone arrangement in accordance with the present disclosure.

FIG. 8A is a cross-sectional view of a microphone arrangement comprising a microphone 800 of an embodiment described herein. As illustrated, the microphone 800 of FIG. 8A is located within a cap 845. The cap may be flexible or rigid and may be any suitable material, such as a metallic material. The cap creates a seal with a substrate 837 (for example, a printed circuit board), such that air only flows into and out of the arrangement via a sound inlet 831. The substrate may be any suitable material. The cap 845 also mitigates electromagnetic interference. Sound waves enter the arrangement, causing the sensor 801 to bend and produce voltage due to the piezoelectric effect, as described herein. The arrangement comprises at least one solder pad such that the microphone arrangement may be soldered to external devices, not shown here. The microphone arrangement further comprises an application specific integrated circuit chip/die ("ASIC") 839. The MEMS microphone is electrically connected by wire bonding 841. Although not shown, it will be appreciated that the wire bonding may be connected to the one or more electrodes of the microphone as described herein. As shown, the back volume of the microphone arrangement is much smaller than the back volume of the known microphone shown in FIG. 7A. A smaller back volume is achievable due to the smaller compliance of the improved sensor as described in embodiments herein, compared to the known sensor. Air enters the air inlet 831, and some air causes the membrane region 801*a* to bend, whilst some air flows between the constraints, and causes the cantilevered region 801*b* to bend. The constraints are designed such that air is able to flow from below the membrane portion to below the cantilevered portion, as will be described in relation to FIG. 8B. The lower constraint is in contact with the substrate 837, and the upper constraint is in contact with the cap 845. The arrangement comprises walls 835 to retain air inside the microphone 800 such that the pressure results in sensor deflection rather than dispersing throughout the area enclosed by the cap 845. The walls 835 are located such that the gap between the free end of the cantilevered region 819 and the walls 835 is optimized for increasing acoustic resistance and improving microphone sensitivity. It will be noted that FIG. 8A is a cross-sectional view of the microphone arrangement, such that MEMS microphone 800, ASIC 839, and cap 845 extend into the page such that they are three-dimensional, as described in relation to other embodiments disclosed herein.

FIG. 8B shows a plan view of the arrangement of FIG. 8A. As shown, the sensor 801 is circular, and the sound inlet 831 is circular. The microphone comprises multiple constraints 807 where the multiple constraints are annular sectors of a circle and are separated by a plurality of air gaps. The multiple constraints 807 result in a membrane region and a cantilevered region of the sensor 801. Air may flow through the air gaps, such that in the packaged microphone, as shown in FIG. 8A, the air may pass between the cantilevered and membrane regions of the sensor. The membrane region is a circle, and the cantilevered region is an annulus located around the outer edge of the membrane region. There may be more or fewer constraints than shown in FIG. 8B, and the air gaps may be larger or smaller than shown in the FIG. 8B.

Figure 10B:
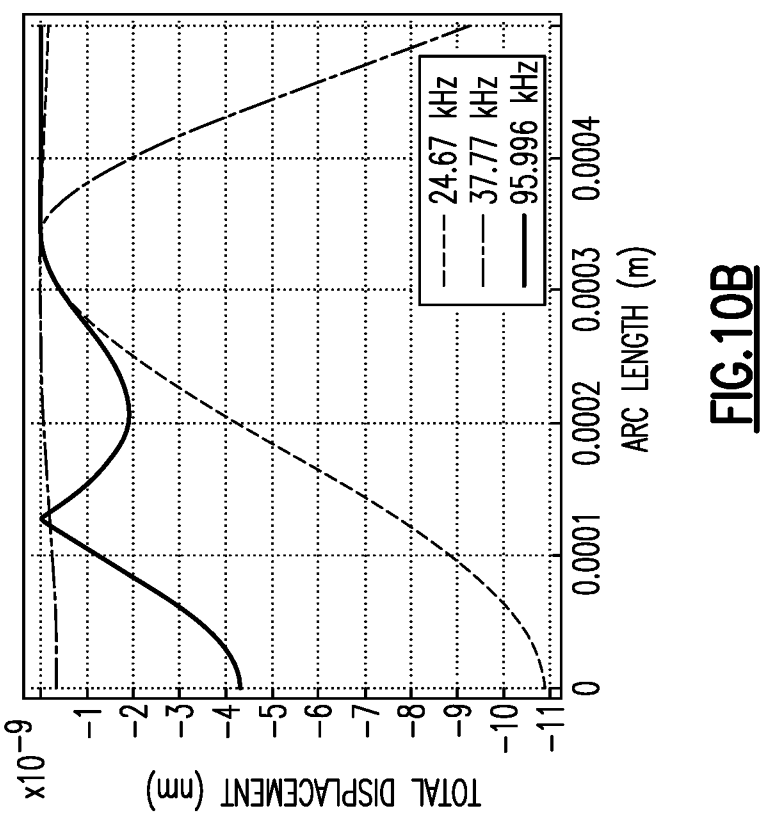
FIG. 10B is a graph showing displacement of a sensor according to aspects of the present disclosure.
Figure 10A:
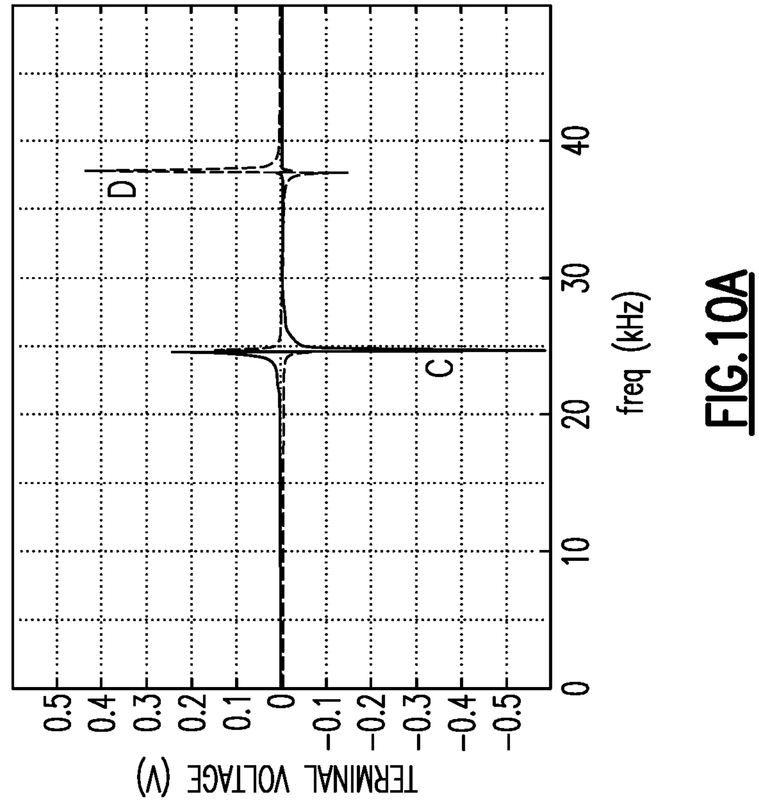
FIG. 10A is a graph showing voltage of a microphone according to aspects of the present disclosure.

FIGS. 10A and 10B show the voltage and displacement of a microphone comprising the sensor as described in FIGS. 5C and 5D, at a wide range frequency, e.g., less than 50 kHz.

FIG. 10A shows the change in terminal voltage (V) with the change in frequency (kHz). The graph shows both the membrane region, solid line labeled C, and the cantilevered region, dashed line labeled D. As shown, the membrane region has a resonant frequency at 24.67 kHz, and the cantilevered region has a resonant frequency at 37.77 kHz. It will be appreciated that these resonant frequencies may vary for sensors comprising different materials or having constraints at different radii of the sensor. The resonant frequency of the cantilevered region is higher than the resonant frequency of the membrane region. The cantilevered and membrane region have substantially the same thickness and therefore have substantially the same stiffness. However, the membrane has a higher moment of inertia due to the membrane region having a greater radius than the cantilevered region, resulting in a lower resonant frequency. The resonant frequency also depends on the compliance of the constrained region. The main resonance modes for both the membrane and cantilevered regions is above the acoustic frequency range, i.e., less than 20 kHz.

As shown, there is a weak coupling, which causes the small resonance at the main mode for the membrane and cantilever. The weak coupling is due to mechanical interaction between the sensor parts.

FIG. 10B shows the displacement profile at different resonant modes. The graph shows the membrane mode, labelled 24.67 kHz, the cantilevered mode, labelled 37.77 kHz, and the second order membrane mode, labelled 95.996 kHz. As shown, at the fixed region there is zero displacement.

The compliant anchor used as the constraints may increase performance of the structure via controlling the level of relative coupling between those two mechanical elements of the sensor.

A sensor according to embodiments described herein may be formed by a known lithography method. Once made, the sensor may be released from the wafer like a single die and can be placed in the microphone module. The constraint is formed in a separate process, on a silicon, silicon dioxide, or PCB base. The constraint may be fabricated of metal or other conductive material to provide electrical contact to the sensor structure. The output from the sensor may be through the constraint. The sensor may be designed to have a contact pad at the constraint. Once the sensor and microphone module have been manufactured, the sensor is arranged such that it is in contact with the at least one constraint to provide mechanical and electrical connection with the sensor. The final device is produced by bounding the top and bottom half of the package with a sensor.

Figure 9:
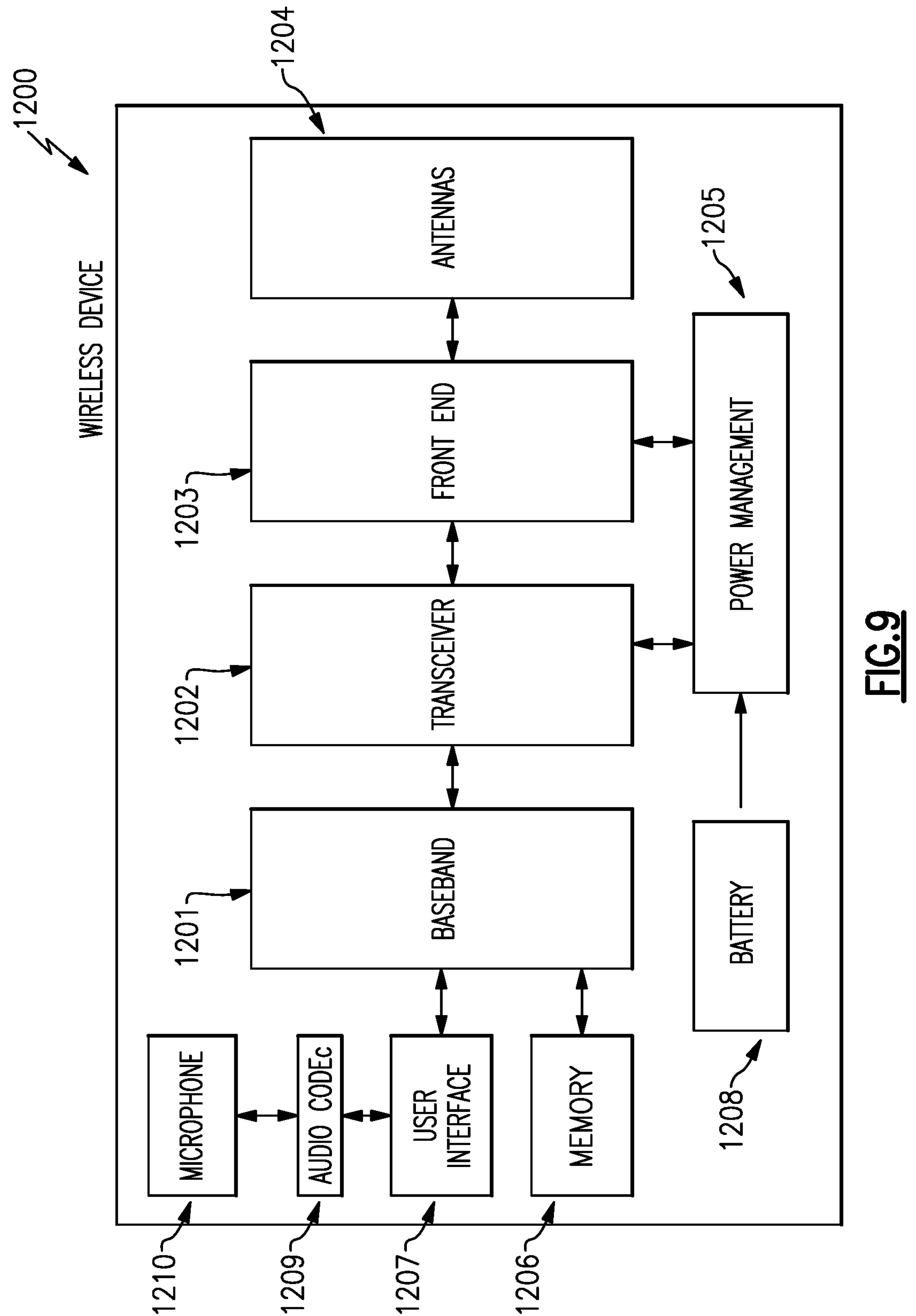
FIG. 9 is a schematic diagram of a wireless device in accordance with the present disclosure.

FIG. 9 is a schematic diagram of one embodiment of a wireless device 1200. The wireless device can be, for example but not limited to, a portable telecommunication device such as, a mobile cellular-type telephone. The wireless device includes a microphone arrangement 1210, including a microphone according to embodiments described herein in relation to FIGS. 2A to 8B, and may include one or more of a baseband system 1201, a transceiver 1202, a front end system 1203, one or more antennas 1204, a power management system 1205, a memory 1206, a user interface 1207, a battery 1208, and audio codec 1209. The microphone arrangement may supply signals to the audio codec 1209 which may encode analog audio as digital signals or decode digital signals to analog. The audio codec 1209 may transmit the signals to a user interface 1207. The user interface 1207 transmits signals to the baseband system 1201. The transceiver 1202 generates RF signals for transmission and processes incoming RF signals received from the antennas.

The transceiver 1203 aids in conditioning signals transmitted to and/or received from the antennas 1204.

The antennas 1204 can include antennas used for a wide variety of types of communications. For example, the antennas 1204 can include antennas 1204 for transmitting and/or receiving signals associated with a wide variety of frequencies and communications standards.

The baseband system 1201 is coupled to the user interface to facilitate processing of various user input and output, such as voice and data. The baseband system 1201 provides the transceiver 1202 with digital representations of transmit signals, which the transceiver 1202 processes to generate RF signals for transmission. The baseband system 1201 also processes digital representations of received signals provided by the transceiver 1202. As shown in FIG. 9, the baseband system 1201 is coupled to the memory to facilitate operation of the wireless device.

The memory can be used for a wide variety of purposes, such as storing data and/or instructions to facilitate the operation of the wireless device and/or to provide storage of user information.

The power management system 1205 provides a number of power management functions of the wireless device.

The power management system 1205 receives a battery voltage from the battery 1208. The battery 1208 can be any suitable battery for use in the wireless device, including, for example, a lithium-ion battery.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the disclosure. Accordingly, the foregoing description and drawings are by way of example only, and the scope of the disclosure should be determined from proper construction of the appended claims, and their equivalents.

What is claimed is:

1. A piezoelectric microelectromechanical systems microphone comprising:

- a sensor including at least one piezoelectric layer;
- at least one constraint in contact with the sensor, the sensor being supported by the at least one constraint, the sensor having a membrane region to one side of the at least one constraint and a cantilevered region to an other side of the at least one constraint, the at least one constraint including an upper constraint and a lower constraint, the upper constraint being mechanically in contact with an upper side of the sensor, the lower constraint being mechanically in contact with a lower side of the sensor; and
- a cavity defined at least partially by the at least one constraint.

2. The microphone of claim 1 wherein the membrane region and the at least one cantilevered region are mechanically coupled in a radial direction.

3. The microphone of claim 1 wherein the sensor is circular.

4. The microphone of claim 1 wherein the at least one constraint forms an annulus whose center is the center of the sensor.

5. The microphone of claim 4 wherein the membrane region is circular, and the cantilevered region is a disc located around an outer edge of the membrane region.

6. The microphone of claim 1 wherein the microphone comprises multiple constraints, each of the multiple constraints being annular sectors of a circle separated by a plurality of air gaps, the plurality of air gaps providing for air to from underneath the membrane region to underneath the cantilevered region.

7. The microphone of claim 1 wherein the at least one constraint has a width substantially smaller than a radius of the sensor.

8. The microphone of claim 1 wherein the upper constraint is mechanically and electrically in contact with an upper side of the sensor, and the lower constraint is mechanically and electrically in contact with a lower side of the sensor.

9. The microphone of claim 1 wherein the upper constraint and lower constraint are located at a same radius of the sensor and in line with each other.

10. The microphone of claim 1 wherein the upper constraint and lower constraint are not in line with each other.

11. The microphone of claim 1 wherein the upper and lower constraints are silicon.

12. The microphone of claim 1 wherein the at least one constraint substantially eliminates movement of the sensor at a radius of the at least one constraint.

13. The microphone of claim 1 further comprising two electrode layers, the two electrode layers being separated into two electrodes, the two electrodes including an inner electrode and an outer electrode.

14. The microphone of claim 13 wherein the inner electrode is located at a center of the membrane region and inwardly displaced from an inner periphery of the cantilevered region.

15. The microphone of claim 13 wherein the outer electrode is located at the at least one constraint.

16. The microphone of claim 15 wherein the outer electrode is an annulus centered at a center of the sensor.

17. The microphone of claim 15 wherein the outer electrode covers a portion of the membrane region and a portion of the cantilevered region.

18. A piezoelectric microelectromechanical systems microphone comprising:

a sensor including at least one piezoelectric layer;

multiple constraints in contact with the sensor and supporting the sensor, the sensor having a membrane region to a first side of the multiple constraints and a cantilevered region to a second side of the multiple constraints, the second side opposite the first side, each of the multiple constraints being annular sectors of a single circle separated by a plurality of air gaps, the plurality of air gaps providing for air to flow from underneath the membrane region to underneath the cantilevered region; and a cavity defined at least partially by the multiple constraints.

* * * * *